United States Patent
Novak et al.

(12)

(10) Patent No.: US 6,273,989 B1
(45) Date of Patent: Aug. 14, 2001

(54) HIGH PERFORMANCE EPOXY BASED LAMINATING ADHESIVE

(76) Inventors: Diane Novak, 16935 E. Redfield Rd., Gilbert, AZ (US) 85234; Thomas F. Gardeski, 1259 E. Louis Way, Tempe, AZ (US) 85284

( * ) Notice: Subject to any disclaimer, the term of this patent is extended or adjusted under 35 U.S.C. 154(b) by 0 days.

(21) Appl. No.: 09/199,039

(22) Filed: Nov. 24, 1998

Related U.S. Application Data

(62) Division of application No. 08/943,323, filed on Oct. 3, 1997, now Pat. No. 5,888,654, which is a division of application No. 08/926,323, filed on Sep. 5, 1997, now abandoned, which is a continuation of application No. 08/479,572, filed on Jun. 7, 1995, now abandoned, which is a continuation of application No. 07/862,983, filed on Apr. 6, 1992, now abandoned, which is a continuation-in-part of application No. 07/483,266, filed on Feb. 15, 1990, now abandoned, which is a continuation of application No. 07/153,141, filed on Feb. 8, 1988, now abandoned.

(51) Int. Cl.$^7$ ......................................................... C09J 5/00
(52) U.S. Cl. ........................................ 156/307.3; 106/330
(58) Field of Search .................................. 156/307.3, 330

(56) References Cited

U.S. PATENT DOCUMENTS 5,176,780 * 1/1993 Schreiber .......................... 156/307.3

* cited by examiner

*Primary Examiner*—Christopher Henderson
(74) *Attorney, Agent, or Firm*—Sheldon & Mak; Denton L. Anderson

(57) ABSTRACT

A process for producing an improved three-dimensional polymeric adhesive material comprises: (1) reacting a starting polymer containing an active hydrogen or hydroxy function with a polyfunctional nucleophile to form an adduct product; and (2) reacting the adduct product with a polyelectrophile to generate a three-dimensional polymeric adhesive material. Preferably, the starting polymer is a high molecular weight polyester, the polyfunctional nucleophile is a polyisocyanate, and the polyelectrophile is at least one polyepoxide. The present invention also encompasses processes for bonding at least two substrates by generating the adhesive material between them, as well as the adhesive material itself. The invention is particularly suitable for bonding electronic components such as printed circuit boards.

8 Claims, No Drawings

HIGH PERFORMANCE EPOXY BASED LAMINATING ADHESIVE

CROSS-REFERENCES

This is a divisional of application(s) Ser. No. 08/943,323 filed on Oct. 3, 1997 now U.S. Pat. No. 5,888,654 which is a Divisional of Ser. No. 08/926,323 filed Sep. 5, 1997 now abandoned which is a continuation of Ser. No. 08/479,572 filed Jun. 7, 1995 now abandoned; which is a continuation of Ser. No. 07/862,983 filed Apr. 6, 1992 now abandoned; which is a Continuation-in-part of Ser. No. 07/483,266 filed Feb. 15, 1990, now abandoned; which is a continuation of Ser. No. 07/153,141 filed Feb. 8, 1988 now abandoned.

This application is a continuation-in-part of application Ser. No. 07/483,266, by Thomas F. Gardeski and Diane G. Novak, filed Feb. 15, 1990, which is, in turn, a continuation of application Ser. No. 07/153,141, by Thomas F. Gardeski and Diane G. Novak, filed Feb. 8, 1988, and now abandoned, both of which are also entitled "A High Performance Epoxy Based Laminating Adhesive." These two applications are hereby incorporated in their entirety by this reference.

BACKGROUND OF THE INVENTION

This invention is directed to three-dimensional polymeric adhesive materials and methods for producing such materials.

During the past quarter century, the rapid growth of the electronic circuits industry has resulted in the development of higher performance construction materials. However, the development of high performance adhesive materials and systems to bond the construction materials together has not kept pace. This lack of higher performance adhesive materials is particularly felt in the assembly of electronic components for use in severe environmental conditions, such as under-the-hood automotive and military applications. Adhesive materials and systems that are currently available meet some of the requirements for such properties as peel strength, chemical resistance, moisture resistance, high temperature stability, dimensional stability, especially in the Z-axis direction, and ease of processing. However, these materials and systems typically fail to meet one or more of these requirements. Therefore, a need exists for an adhesive material that meets all of the requirements for use under severe environmental conditions while retaining ease of application.

SUMMARY

We have developed a three-dimensional adhesive material and a process for preparing it that meets these needs and provides an improved adhesive for use under severe environmental conditions, particularly in the assembly of electronic components.

One aspect of the present invention is a process for producing a three-dimensional polymeric adhesive material. The process comprises:

(1) reacting a starting polymer containing an active hydrogen or hydroxy function with a polyfunctional nucleophile to form an adduct product; and (2) reacting the adduct product with a polyelectrophile to generate a three-dimensional polymeric adhesive material.

The starting polymer can contain an active hydrogen and have a maximum acid value of 2. Such a starting polymer can be selected from the group consisting of polycarboxylic acids, polyesters, polyamides, polyacrylics, polyfunctional phenolic resins, and mixtures thereof. Preferably, in this alternative, the starting polymer is a high molecular weight polyester.

Alternatively, the starting polymer can be a polyfunctional hydroxy-containing polymer having a hydroxy number of at least 10. Preferably, the polyfunctional hydroxy-containing polymer is selected from the group consisting of polyols, polyesters, polyurethanes, and mixtures thereof.

Preferably, the polyfunctional nucleophile is a polyfunctional nitrogen-containing compound. More preferably, the polyfunctional nitrogen-containing compound is selected from the group consisting of polyamines, polyaziridines, polyisocyanates, and mixtures thereof. Most preferably, the polyfunctional nitrogen-containing compound is a polyisocyanate.

Preferably, the polyelectrophile comprises at least one polyepoxide. More preferably, the polyepoxide is selected from the group consisting of bisphenol A-epichlorohydrin epoxies, novolac epoxies, and mixtures thereof. Most preferably, the polyexpoxide comprises a mixture of bisphenol A-epichlorohydrin epoxies and novolac epoxies.

Preferably, when the polyelectrophile comprises at least one polyepoxide, the step of reacting the adduct product with the at least one polyepoxide comprises heating a mixture of the adduct product and the at least one polyepoxide to a temperature between about 250° F. and about 400° F.

Preferably, when a high molecular weight polyester and at least one polyepoxide are used to form the three-dimensional polymeric material, the high molecular weight polyester comprises from about 50% to about 90% by weight of the three-dimensional polymeric adhesive material and the polyepoxide comprises from about 10% to about 50% by weight of the three-dimensional polymeric adhesive material.

Another aspect of the present invention is a process for bonding at least two substrates. The process comprises the steps of:

(1) reacting a starting polymer containing an active hydrogen or hydroxy function with a polyfunctional nucleophile to form an adduct product;

(2) mixing the adduct product with a polyelectrophile to generate a bonding precursor;

(3) applying the bonding precursor between the substrates prior to the reaction between the adduct product and the polyelectrophile; and (4) reacting the adduct product with the polyelectrophile to generate a three-dimensional polymer adhesive material between the substrates, thereby bonding the substrates.

Typically, the substrates are selected from the group consisting of film substrates, foil substrates, and hardboard substrates.

Another aspect of the present invention is a three-dimensional adhesive produced by the process described above. In general, the adhesive comprises:

(1) at least two linear polymer moieties, each moiety comprising a polymer containing nucleophilic nitrogen atoms capable of reaction with an electrophile; and (2) cross-links between the nitrogens of the polymer moieties, each cross-link comprising a polymer linked to the nitrogen atoms of the polymer moieties through reaction of an electrophile with the nitrogen atoms.

Preferably, the linear polymer moieties are selected from the group consisting of polycarboxylic acids, polyesters, polyamides, polyacrylics, polyfunctional phenolic resins, and mixtures thereof.

Preferably, the linear polymer moieties are formed by reaction of a hydroxy-containing polymer with a polyfunctional nitrogen-containing nucleophile.

Preferably, the polyfunctional nitrogen-containing nucleophile is selected from the group consisting of polyamines, polyaziridines, polyisocyanates, and mixtures thereof.

One preferred version of the three-dimensional polymeric adhesive of the present invention comprises:

(1) at least two linear urethane linked polymer moieties, each moiety comprising a hydroxy-terminated polyester linked in urethane linkage by an aromatic isocyanate; and (2) cross-links between the nitrogens of the urethane linked polymer moieties, each cross-link comprising a phenyl-containing polymer linked to the nitrogen atoms of the urethane linkages by —$CH_2$—$CHOH$— linkages, with the methylene groups of the linkages being bonded directly to the nitrogen atoms such that the cross-links form a three-dimensional polymeric structure.

In this version, the cross-links preferably comprise at least one polyepoxide selected from the group consisting of bisphenol A-epichlorohydrin epoxies, novolac epoxies, and mixtures thereof.

More preferably, the polyepoxide comprises a mixture of bisphenol A-epichlorohydrin epoxies having the formula each of the substrates is bonded to at least one other substrate by the adhesive material, the adhesive material comprising:

(a) at least two linear polymer moieties; each moiety comprising a polymer containing nucleophilic nitrogen atoms capable of reaction with an electrophile; and (b) cross-links between the nitrogens of the polymer moieties, each cross-link comprising a polymer linked to the nitrogen atoms of the polymer moieties through reaction of an electrophile with the nitrogen atoms.

DESCRIPTION

I. The Adhesive Production Process

One aspect of the present invention is a process for producing a three-dimensional polymeric adhesive material. The polymeric adhesive material produced by this process has improved peel strength, chemical resistance, moisture resistance, high temperature stability, and dimensional stability. It is easy to process and is particularly suitable for use with electronic construction materials, such as printed circuit boards. In general, this process comprises:

(1) reacting a starting polymer containing an active hydrogen function or hydroxy function with a polyfunctional nucleophile to form an adduct product; and (2) reacting the adduct product with a polyelectrophile to generate a three-dimensional polymeric adhesive material.

The starting polymer can contain an active hydrogen, with a maximum acid value of 2. Such polymers can be polycarboxylic acids, polyesters, polyamides, polyacrylics, polyfunctional phenolic resins, or mixtures thereof.

Alternatively, the starting polymer can be a polyfunctional hydroxy-containing polymer having a hydroxy num-

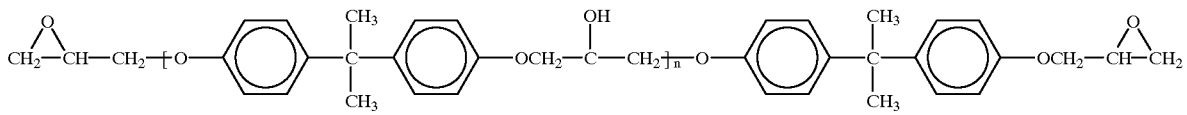

and novolac epoxies having the formula

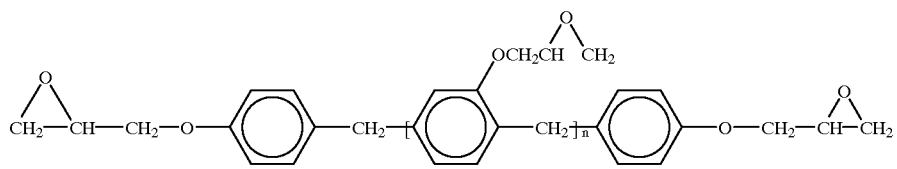

wherein n is an integer from 1 to about 20, n being independently chosen for the bisphenol A-epichlorohydrin epoxies and for the novolac epoxies.

The adhesive material of the present invention can be used to bond at least two substrates, thereby forming a composite structure. A composite structure formed according to the invention comprises:

(1) at least two bondable substrates; and (2) a three-dimensional polymeric adhesive material in adhesive contact with each of the substrates such that ber of at least 10. The polyfunctional hydroxy-containing polymer can be a polyol, a polyester, a polyurethane, or a mixture thereof.

Preferably, the starting polymer is a high molecular weight polyester with hydroxyl end-group functionality of the alcohol type.

The polyfunctional nucleophile can be a polyfunctional nitrogen-containing compound. Such compounds include polyamines, polyaziridines, polyisocyanates, and mixtures thereof. Preferably, the polyfunctional nitrogen-containing compound is a polyisocyanate.

A particularly suitable starting polymer is a polyester resin such as DuPont 49002 base. A particularly suitable polyelectrophile is a polyfunctional isocyanate sold by Mobay Chemical Corp., Pittsburgh, Pa., under the name of Mondur MRS, which is a polymethylene polyphenylene ester of isocyanic acid.

Carbon atoms of alkyl and/or aryl moieties within the starting polymer or polyfunctional nucleophile can be optionally substituted with methyl and/or $C_2$–$C_5$ alkyl. The terms "starting polymer" and "polyfunctional nucleophile", as used herein, include compounds optionally substituted with methyl and/or $C_2$–$C_5$ alkyl.

The reaction of the starting polymer with the polyfunctional nucleophile takes place slowly at room temperature and takes place more rapidly at about 250° F. Typically, this reaction is performed in a solvent, such as a 90%:10% mixture of methylene chloride:cyclohexanone.

The second stage of the process comprised is reacting the adduct product with a polyelectrophile to generate the three-dimensional polymeric adhesive material. The polyelectrophile is preferably a polyepoxide. More preferably, it is a polyepoxide selected from the group consisting of bisphenol A-epichlorohydrin epoxies, novolac epoxies, or a mixture thereof. Most preferably, the polyelectrophile is a mixture of a bisphenol A-epichlorohydrin epoxy, such as Celanese Epi-Rez-5132, and a novolac epoxy, such as Dow DEN 438. The bisphenol A epichlorohydrin epoxy has the following structure:

The reaction of the adduct product and the polyelectrophile preferably takes place at a temperatures from about 250° F. to about 400° F. The first and second stage reactions are depicted below:

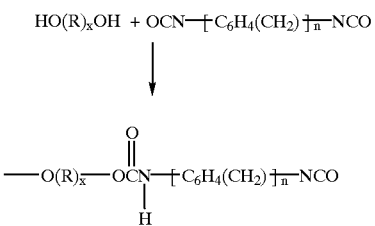

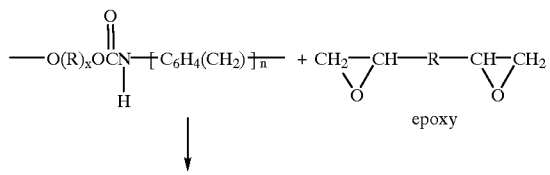

where R represents the ester repeat unit and x represents the number of ester repeat units and n represents the number of organic aromatic repeat units in the isocyanate component.

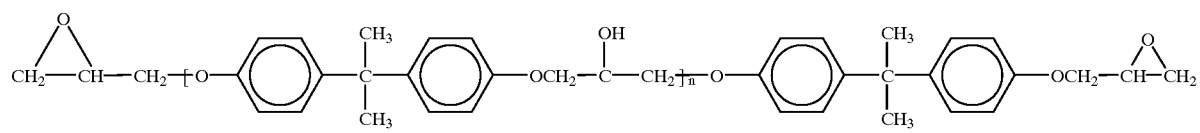

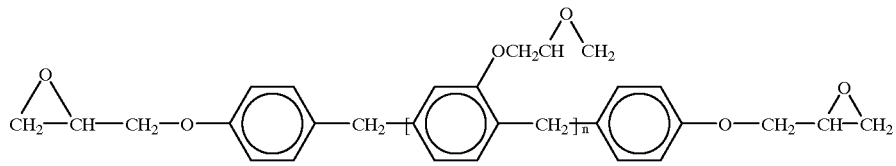

wherein n is an integer from 1 to about 20. The novolac epoxy has the following structure:

wherein n is an integer from 1 to about 20. The values of n are independently chosen for the bis-epi and novolac epoxies.

Preferably, when a high molecular weight polyester and at least one polyepoxide are used to form the three-dimensional polymeric material, the high molecular weight polyester comprises from about 50% to about 90% by weight of the three-dimensional polymeric adhesive material and the polyepoxide comprises from about 10% to about 50% by weight of the three-dimensional polymeric adhesive material.

-continued

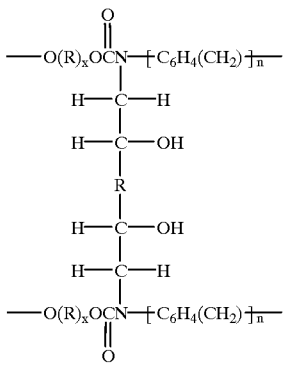

The pressure at which the reaction occurs is generally not critical. The reaction typically takes place at atmospheric pressure.

The reaction typically occurs in an aprotic, moderately polar solvent or a mixture of such solvents. Exemplary solvents are a mixture of methylene chloride and cyclohexanone or methyl ethyl ketone, or a mixture of methylene chloride and cyclohexanone together with methyl ethyl ketone. However, suitable solvents are not to be limited to these combinations; the choice of solvent is generally not critical.

II. Use of the Adhesive for Bonding

The process of producing the adhesive of the present invention can be incorporated into a process for bonding at least two substrates. In general, this bonding process comprises of the steps of:
(1) reacting a starting polymer with a polyfunctional nucleophile to form an adduct product, as described above;
(2) mixing the adduct product with a polyelectrophile to generate a bonding precursor;
(3) applying the bonding precursor between the substrates prior to a reaction between the adduct product and the polyelectrophile; and
(4) reacting the adduct product with the polyelectrophile to generate a three-dimensional polymeric adhesive material between the substrates, thereby bonding the substrates.

The substrates used for this procedure can be film substrates, foil substrates, or hardboard substrates. A typical example of a film substrate is polyimide film. The substrates can be of the same materials or different materials. The substrates can be electronic circuit boards or other electronic structural components.

III. The Adhesive Compound

Another aspect of the invention is an improved three-dimensional polymeric adhesive material comprising:
(1) at least two linear polymer moieties, each moiety comprising a polymer containing nucleophilic nitrogen atoms capable of reaction with an electrophile; and
(2) cross-links between the nitrogens of the polymer moieties, each cross-link comprising a polymer linked to the nitrogen atoms of the polymer moieties through reaction of an electrophile with the nitrogen atoms.

Preferably, the adhesive comprises:
(1) at least two linear urethane linked polymer moieties, each moiety comprising a hydroxy-terminated polyester linked in urethane linkage by an aromatic isocyanate; and
(2) cross-links between the nitrogen of the urethane linked polymer moieties, each cross-link comprising a phenyl-containing polymer linked to the nitrogen atoms of the polyurethanes by —$CH_2$—CHOH— linkages with the $CH_2$ moieties being located adjacent to the nitrogen atoms.

As disclosed above, this adhesive material can be formed in situ for bonding at least two substrates. The substrates can be film substrates, foil substrates, or hardboard substrates.

When at least two or more substrates are bonded by the adhesive of the present invention, a composite material can be formed. The composite material comprises:
(1) at least two bondable substrates; and
(2) the three-dimensional polymeric adhesive material of the present invention in adhesive contact with each of the substrates such that each of the substrates is bonded to at least one other substrate by the adhesive material.

The invention is illustrated by the following example. The example is for illustrative purposes and is not to be construed as limiting the scope of the invention in any manner.

EXAMPLE

An example of the adhesive material of the present invention includes the following components:
(1) a polyester resin having a solids content of 17–20% comprised of Dupont 49002 base in a solvent mixture of 90%:10% (w/w) methylene chloride:cyclohexanone;
(2) an epoxy novolac at 85% solids content composed of Dow DEN 438-EK85 in methyl ethyl ketone;
(3) a bis-epi epoxy composed of Celanese Epi-Rez 5132 at 100% solids content; and
(4) a polyfunctional isocyanate used as a curative component, Mondur MRS from Mobay Chemical Corp.

The components can be combined according to either of the following two procedures:
(1) The adhesive coating composition is made by adding 80% by solids of the polyester component, 10% by solids of the epoxy novolac, 10% by solids of the bis-epi epoxy, and 1.2 parts by weight of the isocyanate in an open container without agitation. The composition is then agitated well for 1 to 5 minutes. The container is then capped with an airtight lid for 30 minutes to allow for the onset of the isocyanate/polyester reaction.
(2) The polyester and isocyanate are combined, thoroughly mixed, and then allowed to stand at room temperature for a minimum of 30 minutes prior to the epoxy addition to allow onset of the isocyanate/polyester reaction.

The adhesive coating composition is then applied by means of the reverse roll coating technique to a 1 mil polyimide film to yield a 1 mil dry coat weight. Drying (i.e., removal of the solvents) is accomplished through a 75-foot, 3-zone oven at 212° F. and 25 feet per minute. The coated substrate is then positioned next to the treated side of a 1 ounce copper foil, where the copper foil surface is treated with Oak CMC-111 compound to enhance bondability. The polyimide film and copper foil are heated to a temperature of 225° F. to 400° F. with an applied pressure of 80 psi (pounds/square inch) to 120 psi through a coater/laminator combining station as part of a continuous operation. The resulting roll is brought onto a six inch core, left at room temperature for 1 to 7 days, then post cured as follows: 2 hours at 150° F., 2 hours at 275° F., and 2 hours at 350° F.

A composite structure was prepared according to the first of the above procedures. The resulting composite structure exhibited the properties shown in Table 1 when tested per ANSI/IPC-FC-232B and 241B procedures:

TABLE 1

| PROPERTIES OF ADHESIVE COMPOSITE STRUCTURE | |
|---|---|
| Initial Peel | 2.0 pli$^a$ |
| Peel After Solder | 21 pli |
| Chemical Resistance: | |
| Methyl Ethyl Ketone | 21 pli |
| Toluene | 20 pli |
| Isopropyl Alcohol | 21 pli |
| Trichloroethylene/Methylene Chloride | 21 pli |
| Solder Float | Pass |
| Aging (96 hours at 275° F. in air circulating oven) | No Bond Strength Change | pli = pounds per linear inch

ADVANTAGES OF THE INVENTION

The present invention provides an adhesive system with extremely balanced properties and the added benefit of superior Z-axis stability through a unique curing mechanism. More specifically, the present invention provides an epoxy-based laminating adhesive that can be continuously processed and cured without the evolution of byproducts to provide a flexible bond-ply with superior overall properties, including excellent Z-axis stability. The adhesive material is applicable to film substrates such as polyimide, foil substrates such as copper, and hardboard substrates, such as FR4 (fiberglass impregnated hardboard). The adhesive of the present invention also possesses superior peel strength, chemical resistance, moisture resistance, and temperature stability. It is particularly suitable for use in the bonding of electronic construction materials, such as those intended for use in severe environmental conditions. In particular, the adhesive of the present invention is suitable for use in under-the-hood automotive and military applications.

Although the present invention has been described in considerable detail with reference to certain preferred versions thereof, other versions are possible. Therefore the spirit and scope of the pending claims should not be limited to the description of the preferred versions contained herein.

We claim:

1. A process for preparing a composite structure comprising:

(a) forming a heat curable adhesive material in the form of a solvent containing (i) at least two linear urethane linked polymer moieties; and (ii) at least one polyepoxide, wherein the heat curable adhesive material in said solvent consists essentially said at least two linear urethane linked polymer moieties and said at least one polyepoxide, said adhesive material being adapted upon heating to form a cured three dimensional polymeric adhesive having cross-links between the nitrogen atoms of the urethane linked polymer moieties;

said cross links comprising a phenyl containing epoxide polymer linked to the nitrogen atoms of the urethane polymer moieties by —CH$_2$—CHOH— linkages, with the methylene (—CH$_2$—) groups of said linkages being bonded directly to said nitrogen atoms, wherein said heat curable adhesive contains about 50% to about 90% by weight of said urethane linked polymer moieties and about 50% to about 10% by weight of said polyepoxide, wherein each moiety comprises a high molecular weight hydroxy terminated polyester joined in urethane linkage by an organic polyisocyanate, and (b) applying the heat curable adhesive material prepared in (a) between two substrates and heating, to cure said material and bond said substances.

2. The process of claim 1 wherein the substrates are subsequently heated to a temperature of about 225 degrees to 400 degrees F. to cure said adhesive material and bond said substrates.

3. The process of claim 1 wherein the adhesive material is curable without the evolution by-products.

4. The process of claim 1 wherein the composite structure which contains said first and said second substrates are chosen from the group comprising polymeric films, metal foils and hardboards.

5. The process of claim 1 wherein said polyepoxide component is a bisphenolepichlorohydrin epoxy or a novolac epoxy.

6. The process of claim 1 wherein said polyepoxide component is selected from the group consisting of bisphenol A-epichlorohydrin epoxies having the formula:

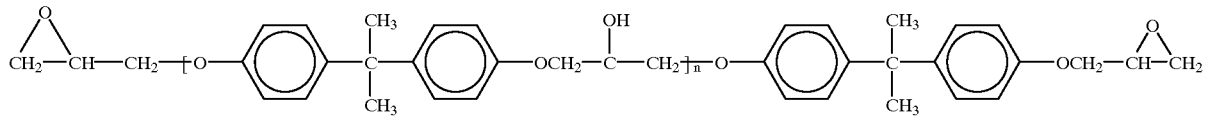

and novolac epoxies having the formula

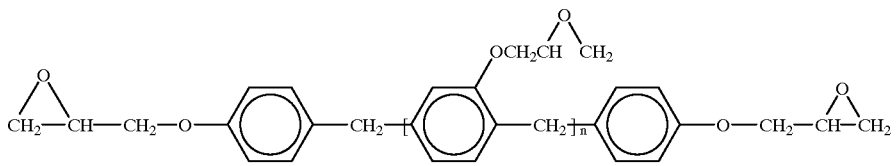

wherein n is an integer from 1 to about 20, n being independently chosen for the bisphenol A-epichlorohydrin epoxies and for the novolac epoxies.

7. The process of claim 1 wherein the poyester has the generic formula:

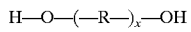

wherein R represents the ester repeating unit and x represents the number of ester repeating units; and the organic polyisocyanate is an aromatic diisocyanate.

8. The process of claim 1 wherein said polyester has an acid value up to 2 and a hydroxyl number of at least 10.

* * * * *